(12) United States Patent
    Inatomi (10) Patent No.: US 8,848,161 B2
(45) Date of Patent: Sep. 30, 2014

(54) RESIST COATING AND DEVELOPING APPARATUS, RESIST COATING AND DEVELOPING METHOD, RESIST-FILM PROCESSING APPARATUS, AND RESIST-FILM PROCESSING METHOD

(71) Applicant: Tokyo Electron Limited, Tokyo (JP)

(72) Inventor: Yuichiro Inatomi, Nirasaki (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 13/799,055

(22) Filed: Mar. 13, 2013

(65) Prior Publication Data
    US 2013/0188158 A1    Jul. 25, 2013

Related U.S. Application Data

(62) Division of application No. 12/752,483, filed on Apr. 1, 2010, now Pat. No. 8,420,304.

(30) Foreign Application Priority Data

Apr. 8, 2009    (JP) ................................. 2009-094269

(51) Int. Cl.
    *G03B 27/32*     (2006.01)
    *B05C 11/00*     (2006.01)
    *B05C 5/00*      (2006.01)
    *G03B 27/52*     (2006.01)

(52) U.S. Cl.
    USPC .................. 355/27; 118/58; 118/63; 118/620

(58) Field of Classification Search
    USPC .................... 355/27; 118/58, 63, 620
    See application file for complete search history.

(56) References Cited

U.S. PATENT DOCUMENTS

| 6,191,007 | B1 | 2/2001 | Matsui et al. |
| 6,492,075 | B1 | 12/2002 | Templeton et al. |
| 6,503,693 | B1 | 1/2003 | Mohondro et al. |
| 6,582,891 | B1 * | 6/2003 | Hallock et al. ................. 430/330 |
| 6,676,757 | B2 * | 1/2004 | Kitano et al. ................. 118/676 |

(Continued)

FOREIGN PATENT DOCUMENTS

| JP | 2002-359182 A1 | 12/2002 |
| JP | 2005-019969 A1 | 1/2005 |
| JP | 2007-317983    | 12/2007 |

OTHER PUBLICATIONS

Japanese Office Action mailed May 7, 2013.

*Primary Examiner* — Amanda C. Walke
(74) *Attorney, Agent, or Firm* — Burr & Brown, PLLC (57) ABSTRACT

The present invention provides a resist coating and developing apparatus, a resist coating and developing method, a resist-film processing apparatus, and a resist-film processing method, capable of reducing a line width roughness by planarizing a resist pattern. The resist coating and developing apparatus comprises: a resist-film forming part configured to coat a resist onto a substrate to form a resist film thereon; a resist developing part configured to develop the exposed resist film to obtain a patterned resist film; and a solvent-gas supply part configured to expose the resist film, which has been developed and patterned by the resist developing part, to a first solvent of a gaseous atmosphere having a solubility to the resist film. A solvent supply part supplies, to the resist film which has been exposed to the first solvent, a second solvent in a liquid state having a solubility to the resist film.

3 Claims, 9 Drawing Sheets

(56) References Cited

U.S. PATENT DOCUMENTS

| | | |
|---|---|---|
| 6,709,807 B2 * | 3/2004 | Hallock et al. ............... 430/322 |
| 6,734,120 B1 * | 5/2004 | Berry et al. ................... 438/715 |
| 6,929,901 B2 | 8/2005 | Lui et al. |
| 7,087,118 B2 * | 8/2006 | Kitano et al. ................ 118/690 |
| 7,129,199 B2 | 10/2006 | Zhang et al. |
| 7,413,848 B2 | 8/2008 | Chung et al. |
| 7,727,895 B2 * | 6/2010 | Asou ............................. 438/698 |
| 7,757,626 B2 * | 7/2010 | Shinya et al. ................ 118/101 |
| 7,807,341 B2 | 10/2010 | Kido |
| 7,819,076 B2 * | 10/2010 | Inatomi ......................... 118/63 |
| 7,875,420 B2 * | 1/2011 | Inatomi ......................... 430/331 |
| 7,977,036 B2 | 7/2011 | Namatsu et al. |
| 7,989,156 B2 | 8/2011 | Inatomi |
| 8,124,320 B2 | 2/2012 | Blalock |
| 8,343,714 B2 * | 1/2013 | Shiraishi et al. .............. 430/331 |
| 2002/0022377 A1 * | 2/2002 | Inada et al. ................... 438/782 |
| 2005/0084807 A1 | 4/2005 | Meagley et al. |
| 2006/0237127 A1 | 10/2006 | Inatomi |
| 2007/0139150 A1 | 6/2007 | Chow et al. |
| 2007/0232080 A1 | 10/2007 | Asou |
| 2007/0272355 A1 * | 11/2007 | Kido .......................... 156/345.1 |
| 2008/0057194 A1 * | 3/2008 | Tanaka ......................... 427/240 |
| 2008/0261125 A1 | 10/2008 | Hishiro |
| 2008/0292991 A1 | 11/2008 | Wallow et al. |
| 2010/0020297 A1 | 1/2010 | Inatomi |
| 2010/0327218 A1 | 12/2010 | Kido |
| 2011/0229831 A1 | 9/2011 | Kido |

* cited by examiner

(a) UNPROCESSED WAFER (b) WAFER TO WHICH SOLVENT GAS WAS SUPPLIED (c) WAFER TO WHICH SOLVENT GAS AND RELEASE LIQUID WERE SUPPLIED (d) WAFER TO WHICH RELEASE LIQUID WAS SUPPLIED WITHOUT SOLVENT GAS BEING SUPPLIED THERETO

FIG. 10

RESIST COATING AND DEVELOPING APPARATUS, RESIST COATING AND DEVELOPING METHOD, RESIST-FILM PROCESSING APPARATUS, AND RESIST-FILM PROCESSING METHOD

CROSS-REFERENCE TO RELATED APPLICATIONS

This application is a divisional of U.S. application Ser. No. 12/752,483, filed Apr. 1, 2010, the entirety of which is incorporated herein by reference, and which claims the benefit under §119(a)-(d) of Japanese Patent Application No. 2009-094269, filed Apr. 8, 2009.

BACKGROUND OF THE INVENTION

1. Field of the Invention

The present invention relates to a resist coating and developing apparatus and a resist coating and developing method, which coats a resist onto a substrate and develops an exposed resist film to form a resist pattern. In particular, the present invention relates to a resist coating and developing apparatus, a resist coating and developing method, a resist-film processing apparatus, and a resist-film processing method, capable of reducing a line width roughness by planarizing the resist pattern.

2. Background of the Invention

In order to manufacture a semiconductor circuit having a higher integrity, further miniaturization is desired. For example, a critical dimension (CD) of an etching mask has reached 32 nm or 22 nm which is smaller than an exposure limitation of an existing exposure apparatus. In a case where a channel of such a width of a field-effect transistor (FET) is formed, if a line width roughness (LWR) of a resist pattern is large, voltage threshold values may become non-uniform, to thereby deteriorate properties as an integrated circuit and/or invite an abnormal operation.

In order to cope with these problems, there has been developed a method for processing a surface of a resist film by supplying a solvent gas to the resist film (Patent Document 1). According to this method, since the surface of the resist film is dissolved by the solvent gas, irregularities of the surface of the resist film are planarized, so that the LWR can be reduced.

Patent Document 1: JP2005-19969A

Patent Document 2: JP2002-359182A

The method of Patent Document 1 has been examined in detail for further improvement, it was found that the resist dissolved by the solvent gas may deform a pattern shape of the resist film. To be specific, although the resist dissolved by a solvent has a viscosity, the resist is likely to swell and thus sag, so that a side surface of the resist film tend to incline. In other words, there is a possibility that, for example, a cross-sectional shape of a line part of the resist film might be a shape having a wide bottom instead of a rectangular shape. As a result, a line width may become broader than a desired line width and/or the pattern shape may deform because of a partial sagging. In this case, a desired shape cannot be transferred to a base layer, which impairs properties of a semiconductor device to be manufactured.

SUMMARY OF THE INVENTION

The present invention has been made in view of the above circumstances. The object of the present invention is to provide a resist coating and developing apparatus, a resist coating and developing method, a resist-film processing apparatus, and a resist-film processing method, capable of reducing a line width roughness of a resist pattern.

In order achieve the above object, a first embodiment of the present invention provides a resist coating and developing apparatus comprising: a resist-film forming part configured to coat a resist onto a substrate to form a resist film thereon; a resist developing part configured to develop the exposed resist film to obtain a patterned resist film; a solvent-gas supply part configured to expose the resist film, which has been developed and patterned by the resist developing part, to a first solvent of a gaseous atmosphere having a solubility to the resist film; and a solvent supply part configured to supply a second solvent in a liquid state having a solubility to the resist film.

A second embodiment of the present invention provides the resist coating and developing apparatus in the first embodiment, further comprising a housing in which the solvent-gas supply part and the solvent supply part are incorporated.

A third embodiment of the present invention provides the resist coating and developing apparatus in the first embodiment, further comprising a heating part configured to heat the resist film which has been exposed to the first solvent.

A fourth embodiment of the present invention provides the resist coating and developing apparatus in the first embodiment, wherein a heating part configured to heat the resist film which has been exposed to the first solvent is further incorporated in the housing.

A fifth embodiment of the present invention provides a resist-film processing apparatus comprising: a solvent-gas supply part configured to expose a resist film, which has been developed and patterned, to a first solvent of a gaseous atmosphere having a solubility to the resist film; and a solvent supply part configured to supply a second solvent in a liquid state having a solubility to the resist film.

A sixth embodiment of the present invention provides the resist-film processing apparatus in the fifth embodiment, further comprising a heating part configured to heat the resist film which has been exposed to the first solvent.

A seventh embodiment of the present invention provides a resist coating and developing method comprising: coating a resist onto a substrate to form a resist film thereon; exposing the resist film; developing the exposed resist film to obtain a patterned resist film; exposing the resist film, which has been developed and patterned by the development, to a first solvent of a gaseous atmosphere having a solubility to the resist film; and supplying, to the resist film which has been exposed to the first solvent, a second solvent in a liquid state having a solubility to the resist film.

An eighth embodiment of the present invention provides the resist coating and developing method in the seventh embodiment, further comprising heating the resist film which has been exposed to the first solvent.

A ninth embodiment of the present invention provides the resist coating and developing method in the seventh or eighth embodiment, wherein the first solvent is one of acetone, propylene glycol monomethyl ether acetate (PGMEA), and N-methyl 2-pyrrolidinone (NMP), or mixture thereof.

A tenth embodiment of the present invention provides the resist coating and developing method in one of seventh to ninth embodiments, wherein the solubility of the second solvent to a part of the resist film which has absorbed the first solvent is higher than the solubility of the second solvent to a part which does not absorb the first solvent.

According to the embodiments of the present invention, there are provided a resist coating and developing apparatus, a resist coating and developing method, a resist-film processing apparatus, and a resist-film processing method, capable of further reducing a line width roughness of a resist pattern.

DETAILED DESCRIPTION OF THE INVENTION

A not-limitative, illustrative embodiment of the present invention will described herebelow with reference to the drawings. Throughout the drawings, the identical or corresponding members or components are shown by the identical or corresponding reference numbers, and overlapped explanation is omitted.

Figure 1:
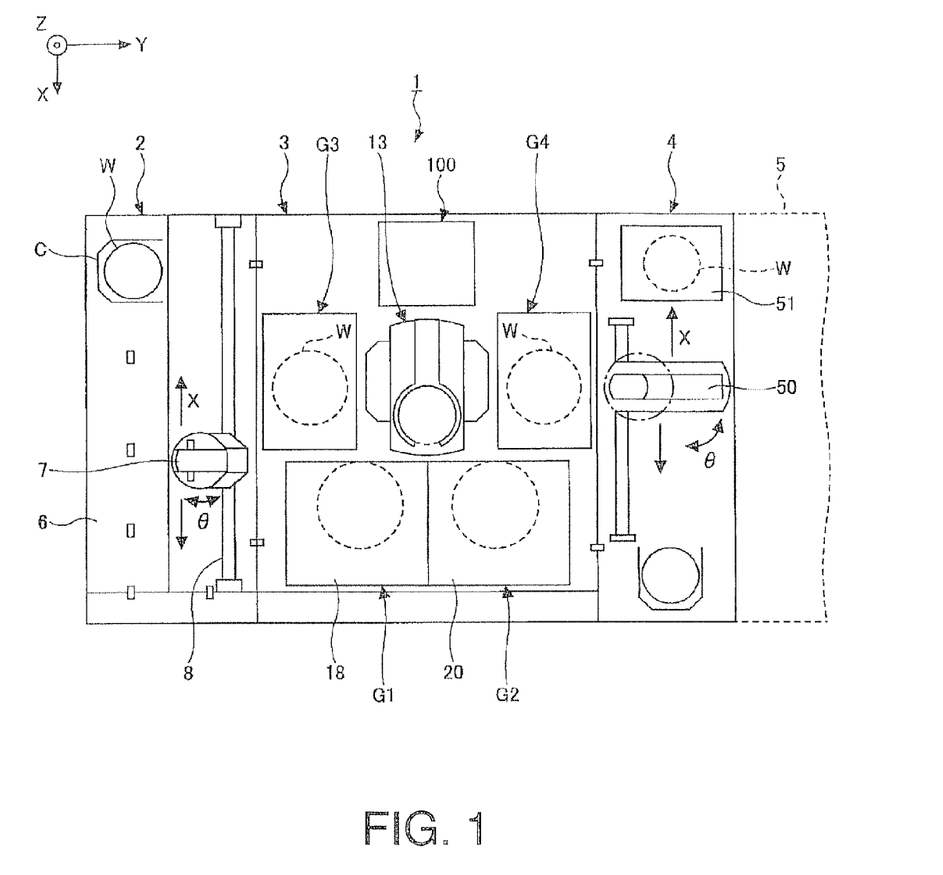
FIG. 1 is a schematic plan view showing a structure of a resist coating and developing apparatus according to an embodiment of the present invention.
Figure 2:
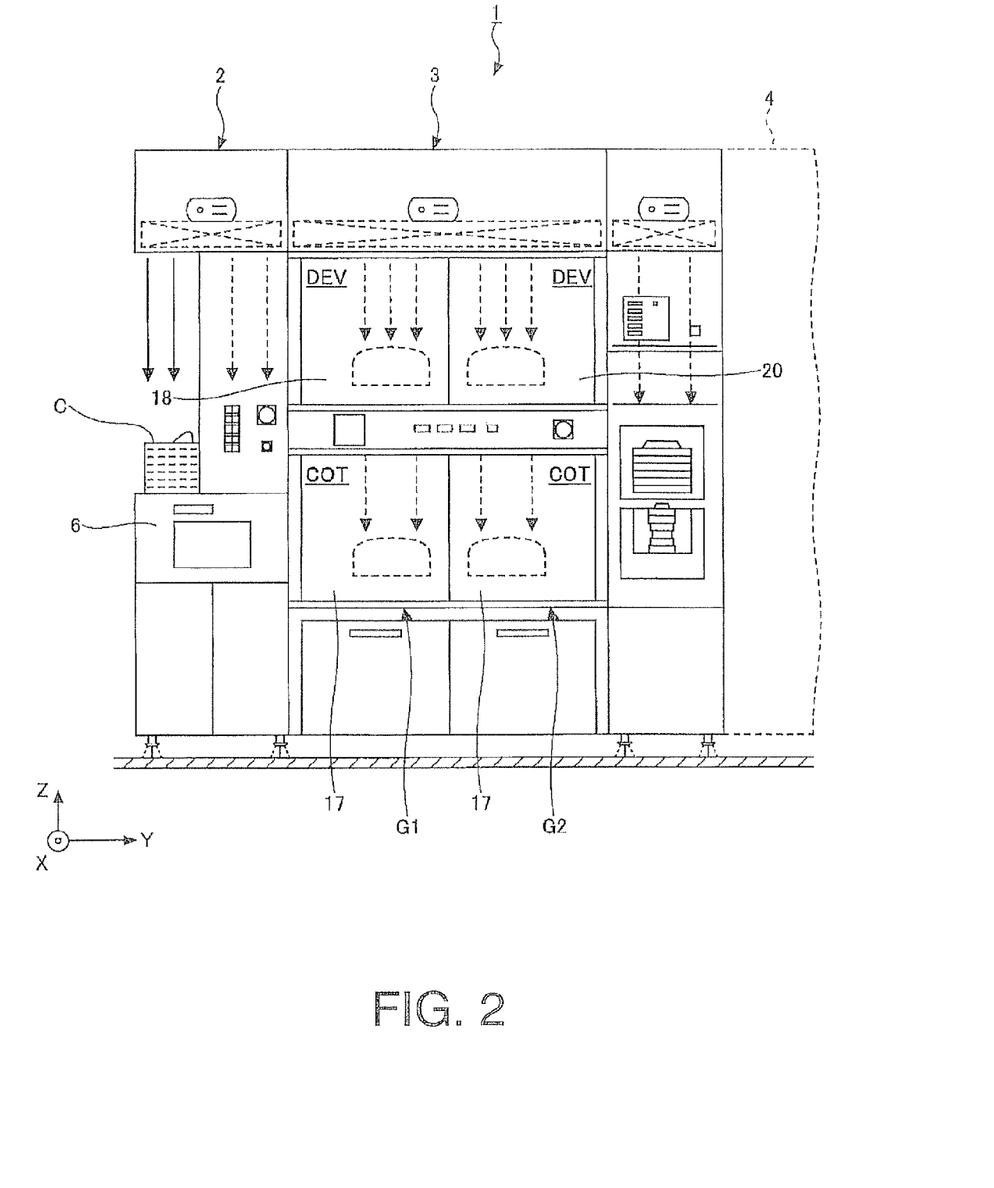
FIG. 2 is a schematic front view of the resist coating and developing apparatus shown in FIG. 1.
Figure 3:
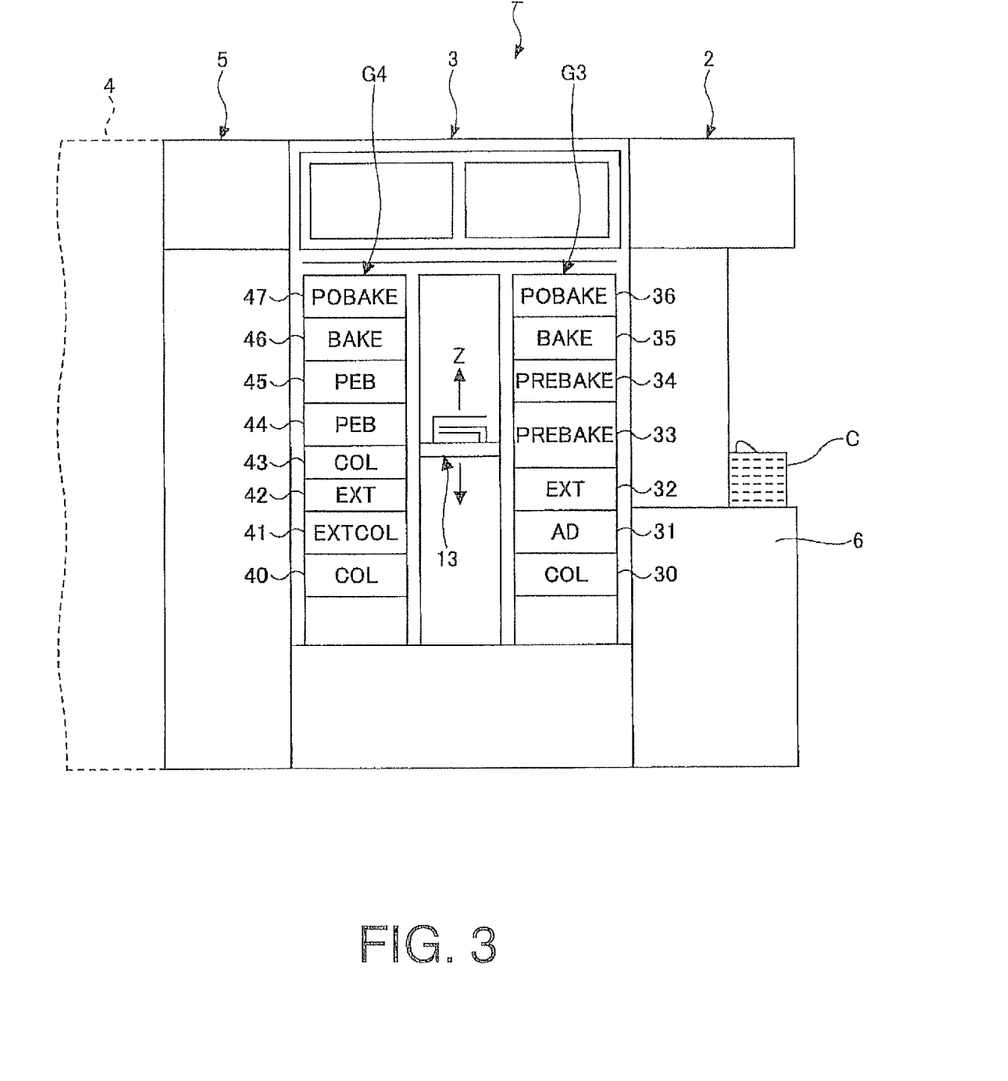
FIG. 3 is a schematic rear view of the resist coating and developing apparatus shown in FIG. 1.

FIG. 1 is a schematic plan view showing a structure of a resist coating and developing apparatus 1 according to an embodiment of the present invention. FIG. 2 a schematic front view of the resist coating and developing apparatus 1. FIG. 3 is a schematic rear view of the resist coating and developing apparatus 1.

As shown in FIG. 1, the resist coating and developing apparatus 1 includes a cassette station 2, a process station 3, and an interface part 4.

The cassette station 2 includes a stage 6 and a wafer transport member 7. A cassette C accommodating, e.g., twenty five wafers W can be placed on the stage 6. The wafer transport member 7 is configured to take out the wafers W from the cassette C placed on the stage 6, and to transport the wafers W between the cassette C and the process station 3. On the stage 6, the plurality of (e.g., four) cassettes C can be placed along an X direction (a longitudinal direction of the cassette station 2) in FIG. 1. The wafer transport member 7 is located between the stage 6 of the cassette station 2 and the process station 3, and is capable of being moved in the X direction along a transport path 8. The wafer transport member 7 has a wafer transport arm 7a which is movable in a Y direction, Z direction (an up and down direction), and a θ direction (a rotating direction about a Z axis). Due to the structure, the wafer transport member 7 can selectively access one of the cassettes C placed on the stage 6, sequentially take out the wafers W accommodated in the cassette C in a tier-like manner in the Z direction, and transport the taken-out wafers W to a third processing apparatus group G3 (described below) of the process station 3. The wafer transport member 7 preferably has an alignment function for aligning the wafers W.

A main transport apparatus 13 is disposed on substantially a central part of the process station 3. Four processing apparatus groups G1, G2, G3, and G4 are arranged around the main transport apparatus 13. As described below, these processing apparatus groups have various processing apparatuses stacked at multiple levels. The first processing apparatus group G1 and the second processing apparatus G2 are located on a plus (+) side in the X direction with respect to the main transport apparatus 13. The third processing apparatus group G3 and the fourth processing apparatus group G4 are located on opposed sides of the main transport apparatus 13 along the Y direction. More specifically, the third processing apparatus group G3 is positioned adjacent to the cassette station 2, and the fourth processing apparatus group G4 is positioned adjacent to the interface part 4.

The main transport apparatus 13 can load and unload the wafers W to and from the various processing apparatuses (described below) included in the processing apparatus groups G1, G2, G3, and G4, and a resist-film processing apparatus 100 (described below).

As shown in FIG. 2, for example, each of the first processing apparatus group G1 and the second processing apparatus group G2 includes a resist coating apparatus 17 configured to coat a resist liquid onto a wafer W to form a resist film thereon, and a developing apparatus 18 disposed above the resist coating apparatus 17, the developing apparatus 18 being configured to develop an exposed resist film.

As shown in FIG. 3, for example, the fourth processing apparatus group G4 includes: a cooling apparatus 40, an extension cooling apparatus 41 configured to naturally cool a wafer W, an extension apparatus 42 configured to transport a wafer W between the main transport apparatus 13 and a wafer transport member 50 (described below), a cooling apparatus 43, post-exposure baking apparatuses 44 and 45 configured to bake an exposed resist film, a spare baking apparatus 46, and a post-baking apparatus 47, in this order from below.

The number and the arrangement of the processing apparatus groups, and the number, the type, and the arrangement of the processing apparatuses disposed in the respective processing apparatus groups, can be optionally selected depending on a process performed in the resist coating and developing apparatus 1 and a device type to be manufactured.

Next, the resist-film processing apparatus 100 is described with reference to FIGS. 4 to 6. As described below, the resist-film processing apparatus 100 is adapted to perform: a planarizing process for planarizing a surface (an upper surface and a side surface) of a patterned (exposed and developed) resist film, by supplying a solvent gas to the resist film; a removal process (slimming process) by a resist release liquid for removing a resist part, which has been dissolved by the solvent gas to become swollen; and a water cleaning process for rinsing the removed resist and the release liquid.

Figure 4:
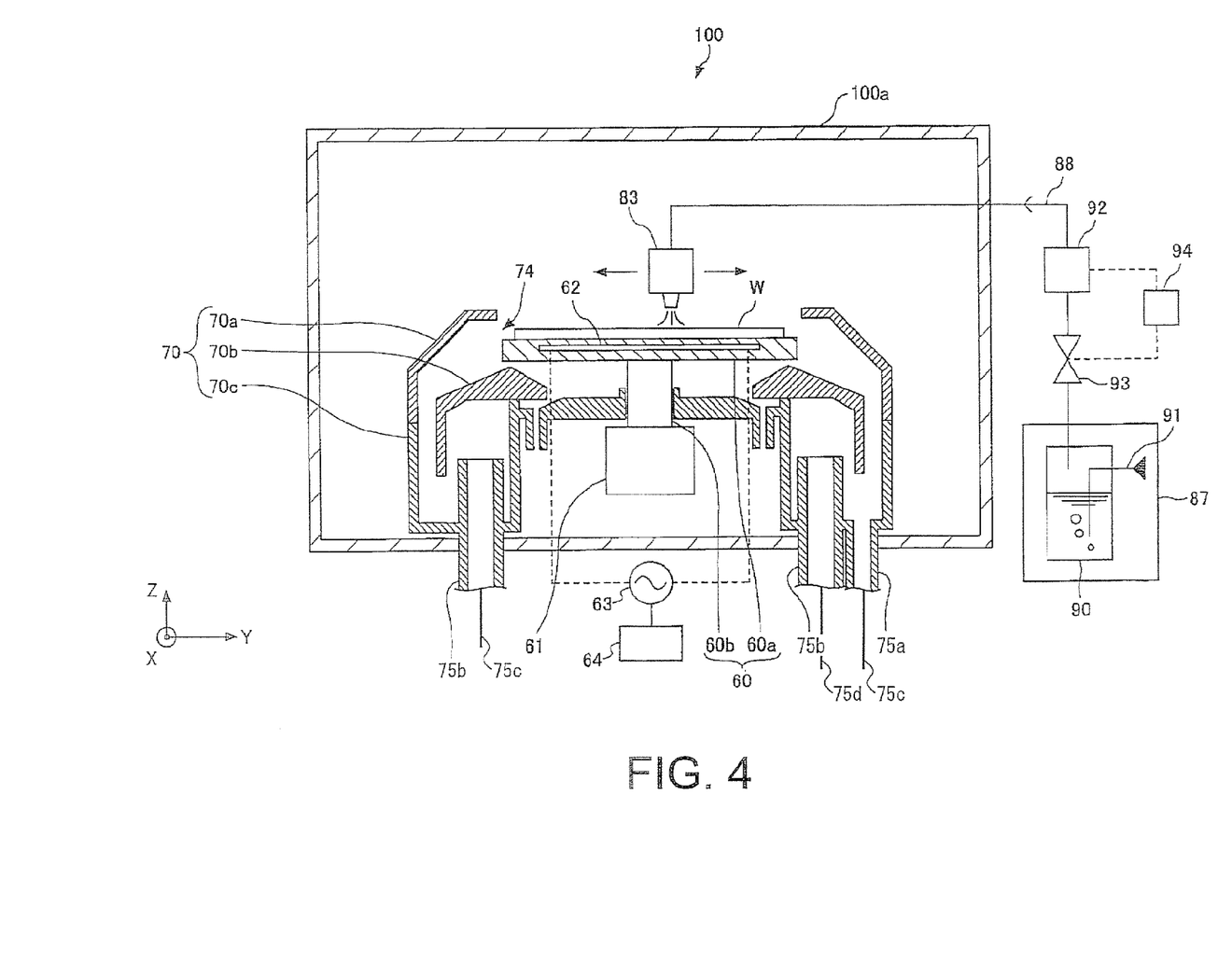
FIG. 4 is a schematic side view of the resist-film processing apparatus included in the resist coating and developing apparatus shown in FIG. 1.
Figure 5:
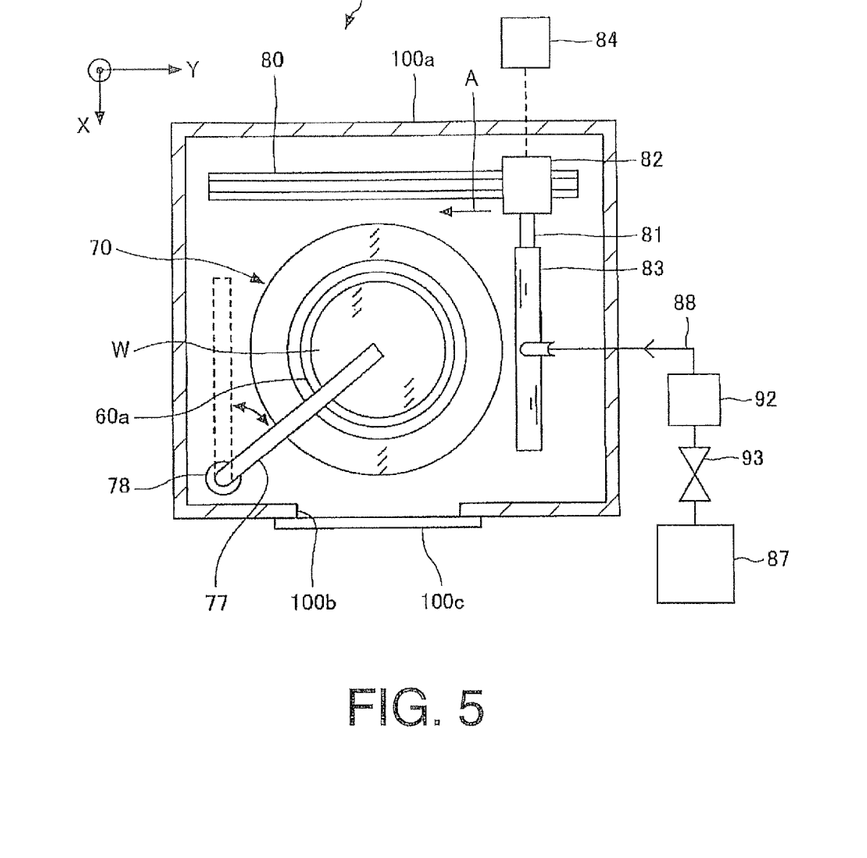
FIG. 5 is a schematic top view schematically showing the resist-film processing apparatus shown in FIG. 4.
Figure 6:
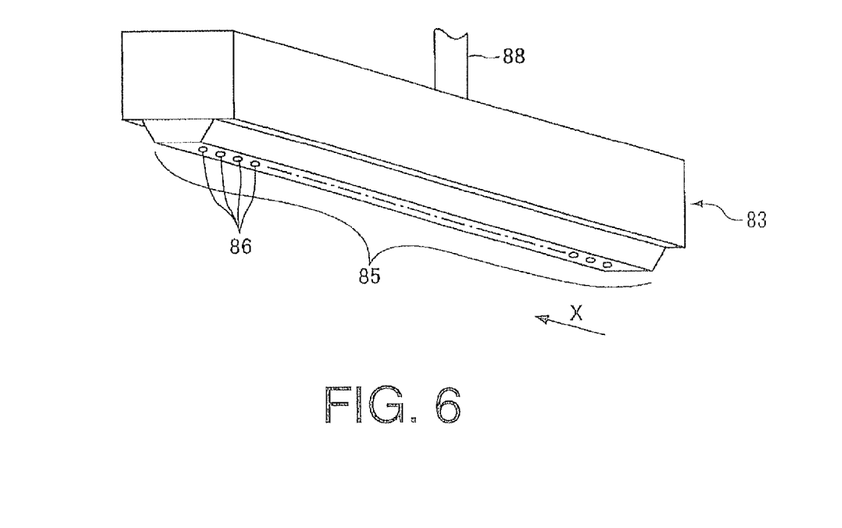
FIG. 6 is a perspective view showing a solvent supply nozzle included in the resist-film processing apparatus shown in FIG. 4.

As shown in FIGS. 4 and 5, the resist-film processing apparatus 100 includes: a cup 70 disposed in substantially a central part of a housing 100a; a chuck 60 disposed in the cup 70, a dispenser 77 configured to supply a release liquid or the like to a surface of a wafer W held by the chuck 60; and a solvent supply nozzle 83 configured to supply a solvent gas to a resist film on the wafer W. As shown in FIG. 5, the housing 100a is provided with a transport opening 100b through which a wafer W transported by the main transport apparatus 13 can pass, and an opening and closing door 100c for opening and closing the transport opening 100b.

As shown in FIG. 4, the cup 70 has an outer cup 70a, an inner cup 70b, and a base 70c. The outer cup 70a can receive the release liquid that is scattered by the rotation of a wafer W and a mist thereof, and can discharge the liquid outside the resist-film processing apparatus 100. The inner cup 70b can receive the release liquid splashed by the outer cup 70a and the release liquid flowing from the wafer W.

The outer cup 70a and the inner cup 70b are substantially concentrically located by the base 70c. A drain port 75a and an exhaust port 75b are formed in a bottom part of the base 70c. The drain port 75a is connected to a drain pipe 75c for draining the release liquid, so that the release liquid flowing from the outer cup 70a and the inner cup 70b is drained outside through the drain port 75a. An upper end of the exhaust port 75b extends higher than the bottom part of the base 70c, such that the release liquid stored in the bottom part of the base 70c is not sucked by the exhaust port 75b. A lower end of the exhaust port 75b is connected to an exhaust pipe 75d in communication with an exhaust system (not shown). Due to the exhaust system, there is formed an air flow which flows from an annular suction opening 74 defined between the outer cup 70a and the below-described chuck 60 to the discharge port 75b through a space between the outer cup 70a and the inner cup 70b so as to be discharged through the exhaust pipe 75d. Thus, the solvent gas, the solvent evaporated from the release liquid, and the mist can be discharged.

The chuck 60 configured to hold and rotate a wafer W is disposed on the central part of the cup 70. The chuck 60 has a wafer holding part 60a for holding the wafer W, and a column 60b for supporting the wafer holding part 60a. The holding part 60a is supported in a substantially horizontal direction. The holding part60a has a flat upper surface and a diameter that is substantially the same as a diameter of the wafer. The wafer holding part 60a is provided with a plurality of suction holes (not shown) opened upward. By sucking the wafer W by means of these suction holes, the wafer W can be held on the upper surface of the wafer holding part 60a. The column 60b of the chuck 60 is joined to a driving part 61. The chuck 60 can be rotated and moved in the up and down direction by the driving part 61. By the upward and downward movement of the chuck 60, the wafer W can be transported to and from the main transport apparatus 13.

Peltier elements 62, for example, are incorporated in the wafer holding part 60a of the chuck 60. The Peltier elements 62 are uniformly arranged in the wafer holding part 60a. A power source 63 of the Peltier elements 63 is controlled by a temperature controlling part 64. The temperature controlling part 64 can change an amount of electricity to be fed to the Peltier elements 62. Thus, temperatures of the Peltier elements 62 can be adjusted, and a temperature of the wafer holding part 60a of the chuck 60 can be set at a predetermined temperature. In this embodiment, the Peltier elements 62, the power source 63, and the temperature controlling part 64 constitute a temperature adjusting mechanism.

With reference to FIG. 5, in the resist-film processing apparatus 100, a rail 80 extending along the Y direction is disposed on a minus (−) side of the cup 70 in the X direction. One end of the rail 80 is positioned on a minus (−) side of the cup 70 in the Y direction, and the other end of the rail 80 is positioned on a plus (+) side of the cup 70 in the Y direction. A driving part 82 including, i.e., a linear motor, is disposed on the rail 80 such that the driving part 82 can be reciprocated along the rail 80. The driving part 82 has an arm 81. Attached to a distal end of the arm 81 is a solvent supply nozzle 83 as a nozzle for jetting a solvent gas to a wafer W. Due to this structure, the solvent supply nozzle 83 can be moved by the driving part 82 so as to pass through a space above the chuck 60. The movement of the solvent supply nozzle 83 is controlled by a drive controlling part 84 configured to control an operation of the driving part 82, for example. the drive controlling part 84 can move the solvent supply nozzle 83 at a predetermined speed in the Y direction. In addition, the driving part 82 is equipped with, e.g., a cylinder for moving the arm 81 in the up and down direction, so that a height of the solvent supply nozzle 83 can be adjusted.

The solvent supply nozzle 83 has an elongated shape along the X direction. One end (an end attached to the arm 81) of the solvent supply nozzle 83 is positioned on the minus (−) side of the wafer holding part 60a of the chuck 60 in the X direction, and the other end of the solvent supply nozzle 83 is positioned on the plus (+) side of the wafer holding part 60a. Further, as shown in FIG. 6, a lower surface of the solvent supply nozzle 83 has a jetting part 85 extending from one end to the other end of the solvent supply nozzle 83 in a longitudinal direction thereof. The jetting part 85 is provided with a plurality of jetting holes 86 which are opened in a lower surface of the jetting part 85 in the longitudinal direction of the solvent supply nozzle 83. These jetting holes 86 communicate with channels inside the solvent supply nozzle 83, and the channels communicate with a solvent supply pipe 88 connected to an upper part of the solvent supply nozzle 83. As shown in FIG. 4, the solvent supply pipe 88 is connected to a solvent-gas supply source 87. Due to this structure, the solvent supply nozzle 83 can introduce a solvent gas supplied from the solvent-gas supply source 87 through the solvent supply pipe 88, and can uniformly jet the introduced solvent gas downward from the jetting holes 86 formed in the lower surface of the solvent supply nozzle 83.

As shown in FIG. 4, the solvent-gas supply source 87 includes: a storage tank 90 connected to, e.g., the solvent supply pipe 88, the storage tank 90 storing a liquid solvent; and a carrier-gas supply pipe 91 configured to supply a carrier gas into the storage tank 90. By supplying a carrier gas from the carrier-gas supply pipe 91 to the liquid solvent in the storage tank 90 (by bubbling the liquid solvent with the carrier gas), the carrier gas containing a solvent steam (hereinafter referred to as "solvent gas") can be pressure-fed into the solvent supply pipe 88. Thus, the solvent gas is supplied to the solvent supply nozzle 83 through the solvent supply pipe 88. As a solvent (first solvent) to be stored in the storage tank 90, there may be used a solvent having a solubility to a resist film which has been developed and patterned. Specifically, the solvent may be one of acetone, propylene glycol monomethyl ether acetate (PGMEA), and N-methyl 2-pyrrolidinone (NMP), or mixture thereof. As the aforementioned carrier gas, an inert gas, such as helium (He) or argon (Ar), or a nitrogen gas may be used.

In addition, the solvent supply pipe 88 is equipped with a flow rate sensor 92 for detecting a flow rate of the solvent gas, and a valve for adjusting the flow rate. A detection result detected by the flow rate sensor 92 is outputted to a flow-rate controlling part 94. Then, the flow-rate controlling part 94 adjusts an opening and closing degree of the valve 93 based on the detection result, whereby the flow rate of the solvent gas to be supplied to the solvent supply nozzle 83 can be adjusted.

Figure 7:
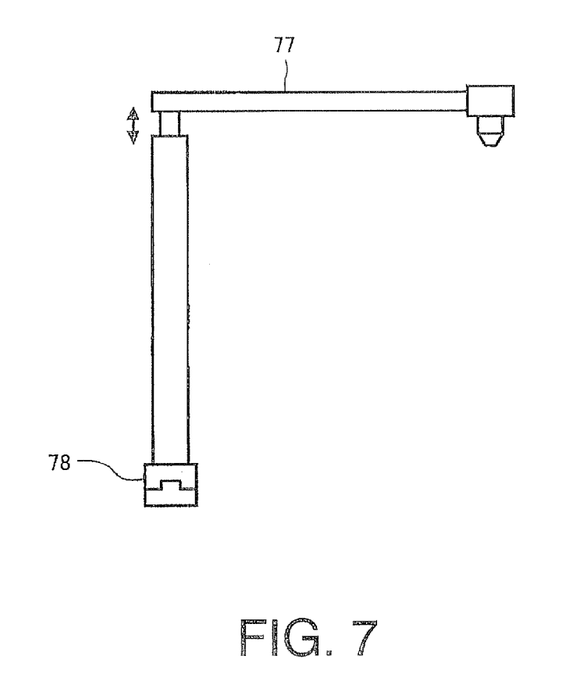
FIG. 7 is a perspective view showing a dispenser included in the resist-film processing apparatus shown in FIG. 4.

The dispenser 77 is configured to supply a release liquid (second solvent) to a patterned resist film on a wafer W. As shown in FIG. 7, a lower end of the dispenser 77 is attached to the driving part 78. The dispenser 77 can be rotated by the driving part 78, and can be located at a standby position shown by the dotted lines in FIG. 5 and at a supply position shown by the solid line in FIG. 5. The dispenser 77 and the driving part 78 has two interior channels (not shown) extending from a lower end of the driving part 78 to a distal end of the dispenser 77. The release liquid can be jetted through the one interior channel, and a pure water or a deionized water for cleaning can be jetted through the other interior channel. Due to this structure, the dispenser 77 can supply the release liquid and the pure water to the wafer W. As the release liquid, any liquid can be used as long as the liquid has a solubility to a resist to be used. Specifically, the release liquid may be a choline solution (trimethyl-2-hydroxyethyl ammonium hydroxide solution) or a KOH solution. Alternatively, a developing liquid may be used instead of the release liquid, or the release liquid may be the same as a solvent for the solvent gas.

As the release liquid (second solvent), it is preferable to select a solvent having a relatively high solubility to a part of the surface of the resist film, which has absorbed the solvent gas so that the part is dissolved by the same and becomes swollen, and has a lower solubility to a part which does not absorb the solvent gas. In this case, the part which has been dissolved by the solvent gas to become swollen can be optionally removed.

Next, an operation (a resist-film processing method in the resist coating and developing apparatus 1) of the resist coating and developing apparatus 1 including the resist-film processing apparatus 100 according to this embodiment is described.

At first, one unprocessed wafer W is taken out by the wafer transport member 7 (FIG. 1) from the cassette C, and is transported to the extension apparatus 32 of the third processing apparatus group G3 (FIG. 3). Then, the wafer W is loaded by the main transport apparatus 13 into an adhesion apparatus 31 of the third processing apparatus group G3. In order that a resist liquid can securely adhere to the wafer W, HMDS, for example, is applied to the wafer W. Then, the wafer W is transported to the cooling apparatus 30, and is cooled to a predetermined temperature. Thereafter, the wafer W is transported to the resist coating apparatus 17. In the resist coating apparatus 17, a resist liquid is coated onto the rotating wafer W, so that a resist film is formed thereon.

The wafer W having the resist film formed thereon is transported by the main transport apparatus 13 to a pre-baking apparatus 33, and the wafer W is subjected to a pre-baking process. Then, the wafer W is transported by the main transport apparatus 13 to the extension cooling apparatus 41, and is cooled there. Further, the wafer W is sequentially transported by the wafer transport member 50 to a peripheral exposure apparatus 51 and an exposure apparatus 5, and is subjected to predetermined processes in the respective apparatuses. In the exposure apparatus 5, an exposure process is performed with the use of a predetermined photomask, so that a latent image of a predetermined pattern is transferred to the resist film. After the exposure process, the wafer W is transported by the wafer transport member 50 to the extension apparatus 42 of the fourth processing apparatus group G4.

Then, the wafer W is transported by the main transport apparatus 13 to the post-exposure baking apparatus 44, and is subjected to a post-exposure baking process. Following thereto, the wafer W is transported to the cooling apparatus 43 and is cooled there. After that, the wafer W is transported by the main transport apparatus 13 to the developing apparatus 18 of the first processing apparatus group G1 or the second processing apparatus group G2, and the wafer W is subjected to a developing process there. Thus, a patterned resist film (resist mask) is formed on the wafer W.

The wafer W, which has been subjected to the developing process, is transported by the main transport apparatus 13 to the resist-film processing apparatus 100 (FIGS. 4 and 5). The wafer W, which has been transported to the resist-film processing apparatus 100, is held by the wafer holding part 60a of the chuck 60 that has been already maintained at a predetermined set temperature of e.g., 23° C. as a normal temperature. At this time, the cup 70 is exhausted by the exhaust system, so that the inside of the resist-film processing apparatus 100 is purged. Also at this time, the dispenser 77 is located at a home position.

After a predetermined time has passed, a temperature of the wafer W reaches 23° C. Then, as shown by the arrow A in FIG. 5, the solvent supply nozzle 83 is moved in the minus (−) Y direction. When the solvent supply nozzle 83 moves from outside the cup 70 to reach a position above the one end of the wafer holding part 60a, the exhaust of the cup 70 is temporarily stopped, for example. Then, the solvent gas is started to be jetted at a constant flow rate from the solvent supply nozzle 83 through the jetting holes 86. Thereafter, the solvent supply nozzle 83 is moved at a constant speed toward the other end of the wafer W (in the minus (−) Y direction), while the solvent gas is being continuously jetted from the solvent supply nozzle 83. Thus, the patterned resist film on the wafer W is exposed to the solvent gas. When the solvent supply nozzle 83 reaches a position above the end of the wafer holding part 60a in the minus (−) Y direction, the solvent supply nozzle 83 turns to move from the other end to the one end of the wafer W (in the plus (+) Y direction). In this manner, the solvent supply nozzle 83 reciprocates above the wafer W, and the solvent gas is supplied to the surface of the resist film on the wafer W.

Upon exposure of the resist film to the solvent gas, the solvent gas is taken into the surface (side surface and upper surface) of the resist film, so that the surface of the resist film dissolves and swells. In addition, the resist, which has now a fluidity because it is dissolved, sags along the side surface of the resist film, whereby the side surface is inclined. It is preferable that the moving speed of the solvent supply nozzle 83 and the supply rate of the solvent gas are determined based on a preparatory experiment or the like, such that only the surface of the resist film is dissolved.

After the reciprocation movement of the solvent supply nozzle 83 has been finished, the supply of the solvent gas is stopped, and the cup 70 is exhausted again.

Subsequently, the dispenser 77 is rotated from the standby position (position shown by the dotted lines in FIG. 5) to the supply position (position shown by the solid line in FIG. 5) in which the distal end of the dispenser 77 is located above the center of the wafer W. Then, the dispenser 77 supplies a predetermined amount of release liquid to the wafer W, and returns to the standby position. The supplied release liquid spreads all over the wafer W, so that the whole surface of the wafer W is covered with a liquid layer of the release liquid by a surface tension of the release liquid. After a predetermined time (time required for the swelling parts of the surface of the resist film to be dissolved) has passed in this condition, the dispenser 77 is rotated such that the distal end there of is located above the center of the wafer W, and the dispenser 77 supplies a pure water to the wafer W. In accordance with the supply of the pure water, the chuck 60 is started to be rotated. The liquid layer of the release liquid covering the wafer W is swept outward by means of the rotation of the wafer W and the pure water supplied thereto, whereby the release liquid and the resist dissolved in the release liquid on the wafer W are washed away. While the wafer W is rotated, the pure water is supplied thereto, for a predetermined period. After that, the supply of the pure water from the dispenser 77 is stopped, and the dispenser 77 is returned to the home position. Then, the rotational speed of the wafer W is increased, so that the wafer W is spin-dried. In this manner, the resist film process is finished.

Thereafter, the wafer W is transported from the wafer holding part 60a of the chuck 60 to the main transport apparatus 13. Then, the wafer W is transported by the main transport apparatus 13 to the post-baking apparatus 47 of the fourth processing apparatus group G4, and is subjected to a post-baking process there. This baking process evaporates slight amounts of the release liquid and the pure water remaining on the wafer W. Thus, the patterned resist film is hardened, whereby deterioration of an anti-etching property of the resist film can be prevented.

Following thereto, the wafer W is transported by the main transport apparatus 13 to the cooling apparatus 40 of the fourth processing apparatus group G4, and is cooled there. Thereafter, the wafer W is returned to the original cassette C via the extension apparatus 32. In this manner, a series of resist coating and developing method including the resist film process is completed for the one wafer W.

As described above, according to the resist coating and developing method according to the embodiment of the present invention, since the parts of the patterned resist film, which have been dissolved by the solvent gas to become swollen, are removed by the release liquid, a bottom widening of the side surface of the resist film, which might be caused by the dissolved swelling parts, can be eliminated. Thus, when a base layer is etched by using this resist film, a desired pattern can be transferred to the base layer.

Further, since the surface of the resist film is dissolved by the solvent to become swollen, irregularities of the side surface of the patterned resist film can be planarized by a surface tension generated at the swelling parts. As a result, the LWR can be reduced.

Furthermore, according to the resist coating and developing apparatus according to this embodiment of the present invention, the solvent gas can be uniformly supplied to the overall surface of the wafer W by the solvent supply nozzle 83. In addition, the parts, which have been dissolved by the solvent gas to become swollen, can be removed by the release liquid supplied from the dispenser 77, and can be cleaned away with the pure water. Namely, since the series of process can be performed in succession in the same apparatus, large decrease of throughput can be prevented.

In addition, another feature according to the embodiment of the present invention is to slim the patterned resist film. Slimming (also referred to as "shrinking" and "trimming") is a method for narrowing a pattern of a resist film, in order to realize a line width that is narrower than an exposure limitation of an existing exposure apparatus. For example, a certain sliming method exposes a patterned resist film to an oxygen plasma so as to ash the resist. In the sliming method using an oxygen plasma, it is necessary to load a wafer to an etching apparatus (asher) after a resist mask has been formed on the wafer in a resist coating and developing apparatus. That is to say, it takes time for the wafer W to be loaded and unloaded. Moreover, to which degree the pattern is narrowed (slimming amount) is controlled by a time in which the resist film is exposed to the oxygen plasma. Thus, there is a possibility that the pattern of the resist film might become too narrow or that all the resist film might be removed.

Patent Document 2 describes a slimming method using an ozone water and an organic solvent such as isopropyl alcohol (IPA), in place of the oxygen plasma. This method includes a slimming step, after a resist-film patterning step, for slimming a resist pattern by etching a resist film by an ozone water and an organic solvent, a cleaning step, a drying step, and a post-baking step.

However, in the slimming method using an ozone water and an organic solvent, since the slimming amount is basically controlled by a slimming period, it is difficult to prevent that the pattern of the resist film becomes too narrow or that all the resist film is removed.

According to the embodiment of the present invention, the surface of the patterned resist film is dissolved by supplying a solvent gas to the resist film, and thereafter, the dissolved resist is removed by the release liquid. Thus, the resist pattern can be narrowed. Moreover, if there is selected as the release liquid a liquid having relatively a high solubility to a part of the surface of the resist film, which has been dissolved by the solvent gas to become swollen, and has a lower solubility to a part which does not swell, the part which has been dissolved by the solvent gas to become swollen can be selectively removed. Namely, a self trimming effect can be provided. Thus, it can be prevented that the pattern of the resist film becomes too narrow or that all the resist film is removed.

According to the resist-film processing apparatus 100 in this embodiment of the present invention, the slimming step can be performed during the resist coating step, the exposure step, and the developing step, which are sequentially performed in the resist coating and developing apparatus including the resist-film processing apparatus 100. Thus, loading and unloading of the wafer W, which are necessary in the slimming step by means of an oxygen plasma, for example, are no more necessary. Therefore, the efficiency of the slimming step can be promoted.

<Alternative Example of Resist-Film Processing Apparatus>

Next, an alternative example of the resist-film processing apparatus according to the embodiment of the present invention will be described with reference to FIG. 8.

Figure 8:
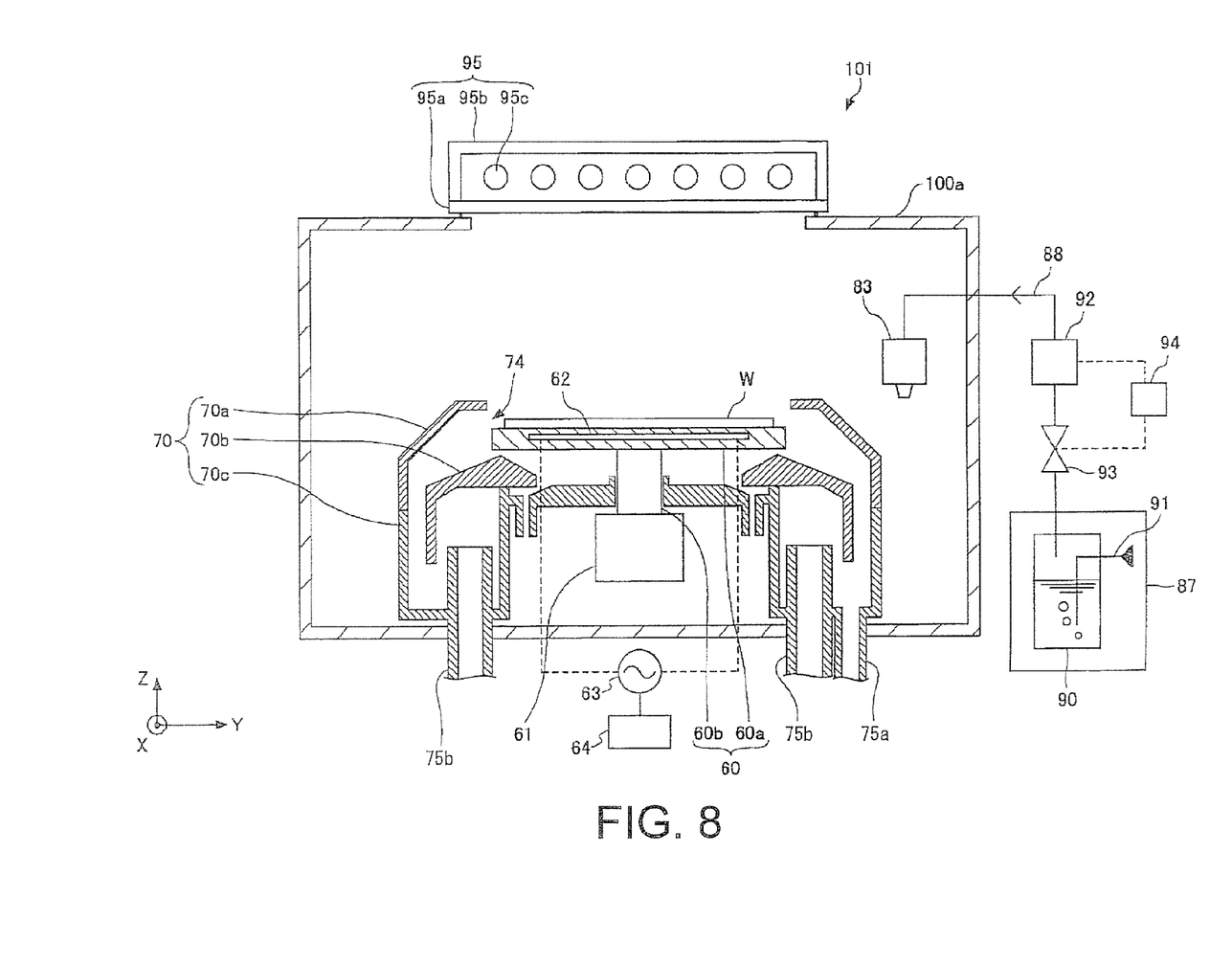
FIG. 8 is a schematic side view schematically showing an alternative example of the resist-film processing apparatus shown in FIG. 4.

As shown in FIG. 8, a resist-film processing apparatus 101 in the alternative example differs from the aforementioned resist-film processing apparatus 100 in that a lamp heater 95 for heating a wafer W held by the chuck 60 is provided. Other structural parts of the apparatuses 101 and 100 are identical to each other.

The lamp heater 95 includes: a window 95a that is hermetically fitted in an opening, which is formed above the chuck 60 of the housing 100a of the resist-film processing apparatus 101, through a sealing member; a plurality of lamps 95c arranged above the window 95a; and a casing 95b covering the window 95a and the lamps 95c. The window 95a is made of a transparent material permeable to light from the lamps 95c. Specifically, the window 95a is preferably made of quartz glass. The lamp 95c may be formed of a heater element in which a heating wire is enclosed in a quartz tube. The heating wire is preferably made of an Fe—Cr—Al alloy, a Ni—Cr alloy, or a metal such as molybdenum, tungsten, or tantalum. The heating wire may be enclosed in a vacuum quartz tube. Alternatively, the heating wire may be enclosed in an inert gas atmosphere such as He or Ar or an $N_2$ gas atmosphere. In addition, the lamp 95c may be structured such that a heating wire is inserted in a quartz tube, and that an inside of the quartz tube is purged by an inert gas such as He or Ar or an $N_2$ gas. It is preferable that an inner surface of the casing 95b is equipped with a reflector (not shown) that can reflect light from the lamps 95c so as to radiate the light to the wafer W. In order that a temperature in the casing 95b is prevented from rising, a channel through which a coolant flows may be provided inside the casing 95b. Further, it is preferable that a ceiling part of the housing 100a of the resist-film processing apparatus 100 has a view port, not shown, such that a temperature of the wafer W is monitored therethrough by a pyrometer. It is furthermore preferable that there is provided a temperature adjusting unit (not shown) for heating the wafer W to a predetermined temperature, to which a signal is inputted from the pyrometer so that a power source (not shown) of the lamps 95c can be controlled based on the signal.

In the resist-film processing apparatus 101 as structured above, after the solvent gas has been supplied to a wafer W, the wafer W can be heated by the lamp heater 95 at about 70° C. to about 130° C. for a predetermined time. Then, as described above, the release liquid is supplied from the dispenser 77 onto the wafer W, so that the wafer W is washed with water and spin-dried. By heating the wafer W between the solvent-gas supplying step and the release-liquid supplying step, the solvent adhering to the wafer W evaporates, so that the wafer W and the patterned resist film on the wafer W are dried. Since the swelling parts of the resist film contract, the resist pattern is planarized, as well as deterioration of an anti-etching property of the resist film can be prevented. In addition, it is found that this heating step can increase a slimming amount. The reason thereof is considered that the solvent taken in the surface of the resist film (or the solvent adhering to the surface) diffuses more deeply by the heating operation.

After the spin-drying step, the wafer W may be heated by the lamp heater 95 so as to reliably dry the wafer W.

EXPERIMENTS

Next, there will be described experiments conducted for confirming the effect of the resist coating method according to the embodiment of the present invention and experiment results. These experiments were conducted by using the resist coating and developing apparatus 1 including the aforementioned resist-film processing apparatus 100. In the experiments, resist films each having a line and space pattern were formed in accordance with the above resist-film processing method, and cross-sections of the resist films were observed by a scanning electron microscope (SEM).

Experiment 1

Figure 9:
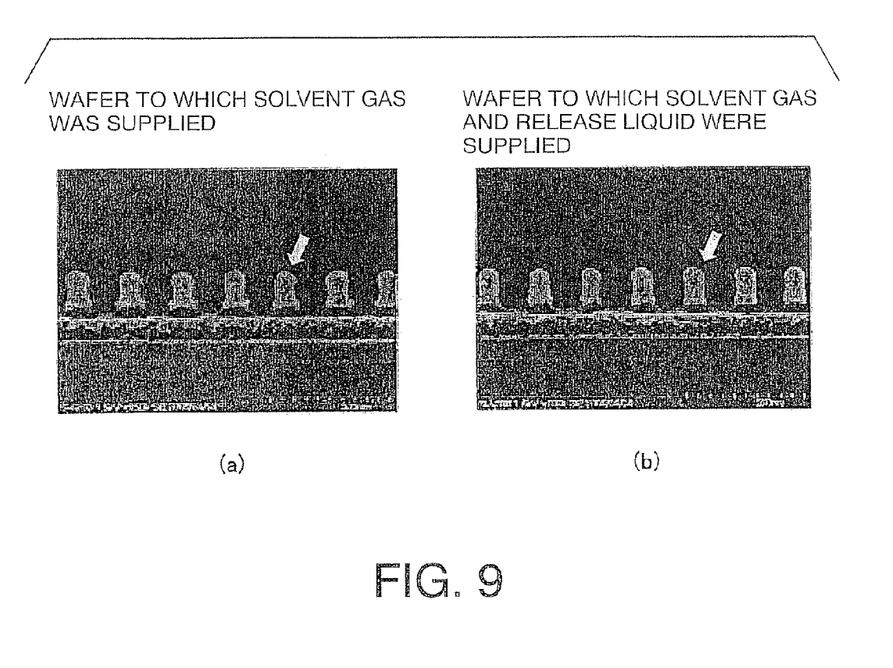
FIGS. 9(a) and 9(b) are views showing results of a first experiment conducted in accordance with a resist coating and developing method according to an embodiment of the present invention.

In Experiment 1, a resist film on a wafer which had been subjected up to the supply of the solvent gas, and a resist film on a wafer which had been subjected up to the supply of the release liquid were compared to each other. FIG. 9 show the result. FIG. 9(a) shows a cross-section of the resist film (a line part of the resist pattern) after the supply of the solvent gas, and FIG. 9(b) shows a cross-section of the resist film (a line part of the resist pattern) after the supply of the release liquid. See, particularly the sectional shapes indicated by the arrows in the drawings. The resist cross-section shown in FIG. 9(a) has a bell-like shape because of the supply of the solvent gas. On the other hand, the resist cross-section shown in FIG. 9(b) after the supply of the release liquid has substantially a rectangular shape, although an upper part thereof is somewhat rounded. Namely, the following facts can be understood. Since the parts dissolved by the solvent gas sagged, the cross-section of the resist pattern has the bell-like shape. After the sagging parts had been removed by the release liquid, the cross-section of the resist pattern has the rectangular shape.

Experiment 2

In Experiment 2, four wafers were prepared, and these wafers were subjected up to the developing process to form resist patterns thereon. At this stage, as a sample for comparison, one wafer was taken out from the resist coating and developing apparatus 1 (this wafer is referred to as "wafer a" for the matter of convenience). Then, one (referred to as "wafer b") of the rest three wafers was transported to the resist-film processing apparatus 100 and was exposed to the solvent gas. The wafer b was taken out, without any release liquid being supplied thereto. Then, one (wafer c) of the rest two wafers was transported to the resist-film processing apparatus 100. The wafer c was exposed to the solvent gas, and the release liquid was supplied thereto. Then, the wafer c was washed with water, dried, and taken out. The last one wafer (wafer d) was transported to the resist-film processing apparatus 100. Then, the release liquid was supplied to the wafer d, without the wafer d being exposed to the solvent gas.

Figure 10:
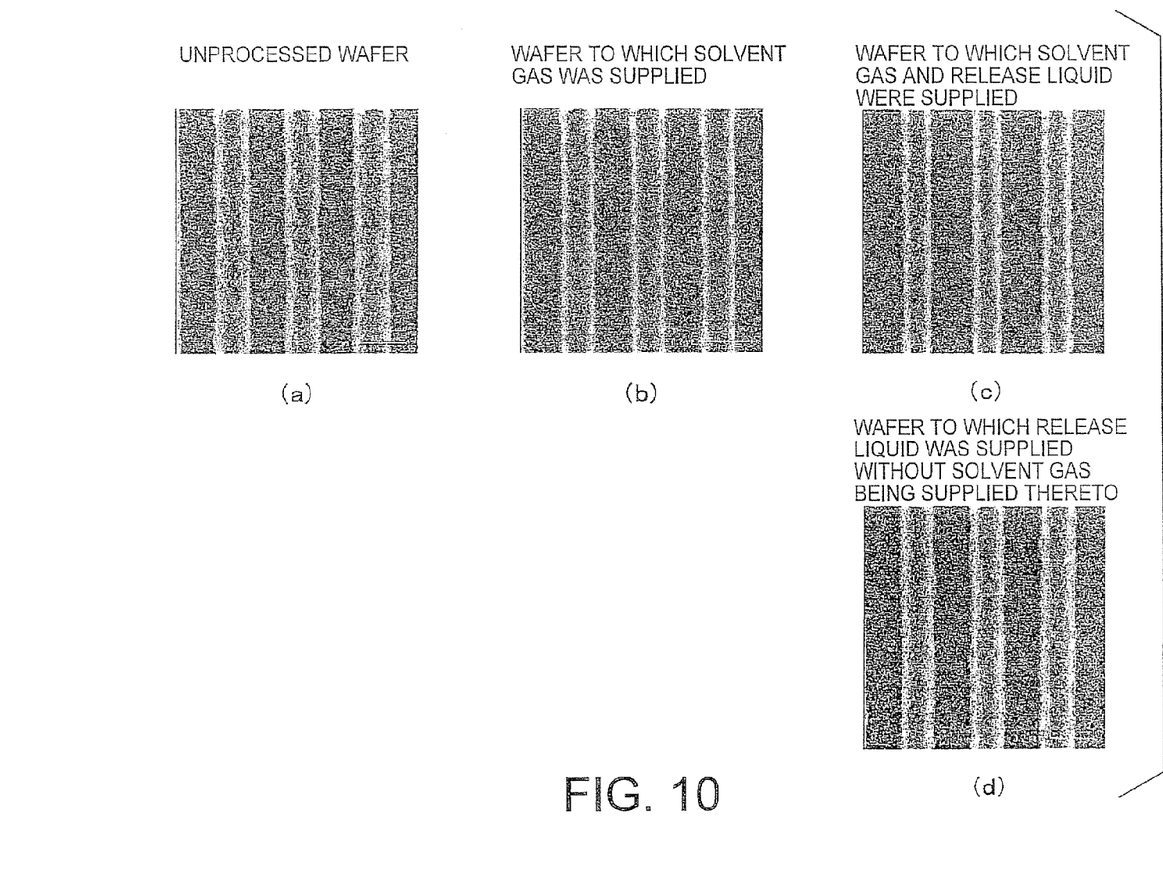
FIGS. 10(a) to 10(d) are views showing results of a second experiment conducted in accordance with the resist coating and developing method according to the embodiment of the present invention.

FIG. 10 show the result. FIGS. 10(a) to 10(d) respectively show SEM images of upper surfaces of the line and space patterns on the wafers a to d. The following table shows average line widths and average LWRs obtained from these results.

|  | wafer a FIG. 10(a) | wafer b FIG. 10(b) | wafer c FIG. 10(c) | wafer d FIG. 10(d) |
| --- | --- | --- | --- | --- |
| Line Width (nm) | 128.5 | 124.4 | 104.9 | 120.4 |
| LWR (nm) | 10.6 | 8.0 | 9.2 | 10.0 |

In the wafer a which was subjected up to the developing process, the LWR is 10.6 nm. On the other hand, in the wafer b which was exposed to the solvent gas after the developing process, the LWR is 8.0 nm. Thus, it can be understood that the LWR is improved by not less than 20%. In the wafer c which was subjected to the process with the release liquid after the process with the solvent gas, the LWR is 9.2 nm. Thus, it can be understood that the LWR is improved more than 10% as compared with the wafer a, although the improvement comes short of the improvement of the wafer b. On the other hand, in the wafer d which was subjected to only the process with the release liquid, without being subjected to a process with the solvent gas, the LWR is 10.0 nm. Thus, almost no improvement is found in the wafer d. From these results, it can be said that the improvement effect of LWR is mainly produced by the solvent gas.

In the wafer c which was subjected to the process with the release liquid, the line width is 104.9 nm. Thus, as compared with the line width (128.5 nm) of the wafer a which was subjected to the developing process, it can be understood that the line width becomes narrower by about 18%. Since the line width of the wafer d, which was subjected only to the process with the release liquid without being subjected to a process with the solvent gas, is 120.4 nm, it can be considered that the slimming effect is produced by removing the parts, which has been dissolved by the solvent gas to become swollen, by means of the release liquid.

From the above results, the effect of the embodiment of the present invention is understood.

A solvent of the solvent gas used in Experiments 1 and 2 was NMP, and the same liquid as the developing liquid, which had been used for the developing process after exposure, was used as the release liquid. In addition, although a KrF resist was used in Experiments 1 and 2, it was confirmed that the same effect can be obtained when an ArF resist is used.

The present invention has been described referring to the suitable embodiment of the present invention. However, the present invention is not limited to the aforementioned embodiment, and can be variously modified in view of the attached claims.

For example, in the above description, the resist-film processing apparatus 100 supplies the solvent gas to the patterned resist film on the wafer W, and supplies the release liquid to the wafer W by using the dispenser 77. However, the wafer W may be transported by the main transport apparatus 13 to the developing apparatus 18 after the supply of the solvent gas, and the swelling parts of the surface of the driest film may be removed in the developing apparatus 18. In this case, the resist-film processing apparatus 100 is not required to have a structure, such as the solvent supply nozzle 83, for supplying the solvent liquid.

In addition, instead of the resist-film processing apparatus 100, the resist coating and developing apparatus 1 may be provided with a solvent-gas supply chamber in which a developed and patterned resist film can be exposed to the solvent gas, and a liquid processing part by which parts of the resist film, which have been dissolved by the solvent gas to become swollen, can be removed by the release liquid. In this structure, the resist film is exposed to the solvent gas in the solvent-gas supply chamber, and the wafer is transported from the solvent-gas supply chamber to the liquid processing part. In the liquid processing part, the release liquid is supplied to the wafer. Alternatively, in the course of the transport of the wafer from the solvent-gas supply chamber to the liquid processing part, the resist film, which has been exposed to the solvent gas, may be baked in the baking apparatus 36 of the third processing apparatus group G3 or the baking apparatuses 44 and 45 of the fourth processing apparatus group G4.

The solvent-gas supply chamber may be structured such that the solvent gas can be supplied under a reduced-pressure atmosphere. In this case, the solvent gas will not outflow from the solvent-gas supply chamber, whereby an atmosphere in the resist coating and developing apparatus 1 can be prevented from being contaminated by the solvent. In addition, in the reduced-pressure atmosphere, not the solvent gas but the solvent may be sprayed onto the wafer (bubbling is not needed), by introducing the solvent to the reduced-pressure atmosphere through a nozzle inserted in the solvent-gas supply chamber or small openings formed in the solvent-gas supply chamber.

The resist-film processing apparatus 100 generates the solvent gas by bubbling, and supplies the solvent gas to the wafer W through the solvent supply nozzle 83. However, for example, a mist of the solvent (first solvent) may be generated by using an ultrasonic atomizer, and the generated mist may be supplied to the wafer W.

In addition, the resist-film processing apparatus 100 or 101 is not necessarily included in the resist coating and developing apparatus 1, but may be independently installed.

In addition, the substrate on which a resist film is formed is not limited to a semiconductor wafer, and may be a substrate for flat panel display (FPD). The resist coating and developing apparatus, the resist coating and developing method, and the resist-film processing apparatus according to the embodiment of the present invention may be used for manufacturing an FPD.

The invention claimed is:

1. A resist coating and developing apparatus comprising:
a resist-film forming part configured to coat a resist onto a substrate to form a resist film thereon;
a resist developing part configured to develop the exposed resist film to obtain a patterned resist film;
a resist-film processing part comprising:
  a separate housing for the resist film processing part;
  a solvent-gas supply part, including a movable solvent supply nozzle, provided within the housing and configured to expose the resist film, which has been developed and patterned by the resist developing part, to a first solvent of a gaseous atmosphere having a solubility to the resist film; and
  a solvent supply part, including a movable dispenser, provided within the housing and configured to supply to the resist film, which has been exposed to the first solvent, a second solvent in a liquid state having a solubility to the resist film, wherein the movable dispenser provides pure water for cleaning away the second solvent on the substrate;
  a substrate chuck, holding the substrate within the housing during exposure of the resist-film to the first solvent, the second solvent and the pure water, wherein the substrate chuck rotates to remove the pure water on the substrate; and
a control unit for performing a resist coating and developing method comprising:
  coating the resist onto the substrate to form the resist film thereon,
  exposing the resist film,
  developing the exposed resist film to obtain the patterned resist film,
  exposing the resist film, which has been developed and patterned by the development, to the first solvent of a gaseous atmosphere having a solubility to the resist film,
  supplying, to the resist film which has been exposed to the first solvent, the second solvent in a liquid state having a solubility to the resist film,
  dispensing pure water for cleaning away the second solvent on the substrate, and
  rotating the substrate chuck to remove the pure water on the substrate;
wherein a solubility of the second solvent to a part of the resist film which has absorbed the first solvent so that the part is dissolved by the first solvent and becomes swollen, is higher than a solubility of the second solvent to a part which does not absorb the first solvent.

2. The resist coating and developing apparatus according to claim 1, further comprising a heating part configured to heat the resist film which has been exposed to the first solvent.

3. The resist coating and developing apparatus according to claim 1, wherein a heating part configured to heat the resist film which has been exposed to the first solvent is incorporated in the housing.

* * * * *